United States Patent [19]

Jacoby et al.

[11] Patent Number: 4,506,252
[45] Date of Patent: Mar. 19, 1985

[54] TERNARY DATA ENCODING SYSTEM

[75] Inventors: George V. Jacoby, Los Altos, Calif.; Martin Cohn, Arlington, Mass.

[73] Assignee: Sperry Corporation, New York, N.Y.

[21] Appl. No.: 511,044

[22] Filed: Jul. 5, 1983

Related U.S. Application Data

[63] Continuation of Ser. No. 260,248, May 5, 1981, abandoned.

[51] Int. Cl.³ .............................................. H04L 3/00
[52] U.S. Cl. .............................. 340/347 DD; 360/39; 360/40
[58] Field of Search .................... 340/347 M, 347 DD; 360/39-43; 455/608-611

[56] References Cited

U.S. PATENT DOCUMENTS

| | | | |
|---|---|---|---|
| Re. 30,182 | 12/1979 | Howson | 340/347 DD X |
| 2,700,696 | 1/1955 | Barker | 340/347 DD X |
| 3,408,483 | 10/1968 | Zuse | 235/436 |
| 3,713,123 | 1/1973 | Lipp | 360/40 |
| 3,898,647 | 8/1975 | Morra et al. | 340/347 DD |
| 4,003,041 | 1/1977 | Van Duuren et al. | 340/347 DD |
| 4,020,282 | 4/1977 | Halpern | 340/347 DD X |
| 4,245,263 | 1/1981 | Rathbun et al. | 360/43 X |
| 4,260,952 | 4/1981 | Thomas, Jr. | 360/43 X |

FOREIGN PATENT DOCUMENTS 5272502 12/1975 Japan .................................. 455/609

OTHER PUBLICATIONS

Horiguchi et al., An Optimization of Modulation Codes—, IEEE Transactions on Magnetics, MAG-12, No. 6, 11/1976, pp. 740-742.

Jacoby, A New Look-Ahead Code for Increased Density, IEEE Transactions on Magnetics, MAG-13, No. 5, 9/1977, pp. 1202-1204.

Geffon, A 6K Bpi Disk Storage System Using Mod-11 Interface, IEEE Transactions on Magnetics, MAG-13, No. 5, 9/1977, pp. 1205-1207.

The Engineering Staff of Analog Devices, Inc., Analog-Digital Conversion Handbook, 6/1972, pp. I-8; II-81.

Primary Examiner—T. J. Sloyan
Attorney, Agent, or Firm—John B. Sowell; Thomas J. Scott; Marshall M. Truex

[57] ABSTRACT

Apparatus and method for encoding binary data in a ternary format including ternary 0, ternary 1 and ternary 2 code symbols. In a preferred embodiment of the invention utilized for magnetic data storage, a ternary 0 is represented by the absence of signal change, a ternary 1 is represented by a single transition and a ternary 2 is represented by a pulse or pair of closely spaced transitions. Further features of the invention provide for merging ternary code symbols so as to prevent the spacing between adjacent symbols from becoming so small as to create undesirable crowding, and inserting and shifting symbols to prevent the spacing between adjacent symbols from becoming so great as to adversely affect recovery of the encoded data.

13 Claims, 6 Drawing Figures

Fig-1

| BINARY WORD | | THEORETICAL CODE WORD | | |
|---|---|---|---|---|
| D1 | D2 | P1 | P2 | P3 |
| 0 | 0 | 0 | 1 | 0 |
| 0 | 1 | 0 | 2 | 0 |
| 1 | 0 | 1 | 0 | 0 |
| 1 | 1 | 2 | 0 | 0 |

| SERIAL NUMBER | DATA WORDS | | | | TERNARY CODE WORDS | | | | | |
|---|---|---|---|---|---|---|---|---|---|---|
| | PRESENT | | FOLLOWING | | PRESENT | | | FOLLOWING | | |
| | D1 | D2 | D'1 | D'2 | P1 | P2 | P3 | P'1 | P'2 | P'3 |
| 0 | 0 | 0 | 0 | 0 | 0 | 1 | 0 | 0 | 1 | 0 |
| 1 | 0 | 0 | 0 | 1 | 0 | 1 | 0 | 0 | 2 | 0 |
| 2T | 0 | 0 | 1 | 0 | 0 | 1 | 0 | 1 | 0 | 0 |
| 2 | 0 | 0 | 1 | 0 | 0 | 0 | 1 | 0 | 0 | 0 |
| 3T | 0 | 0 | 1 | 1 | 0 | 1 | 0 | 2 | 0 | 0 |
| 3 | 0 | 0 | 1 | 1 | 0 | 0 | 0 | 2 | 0 | 0 |
| 4 | 0 | 1 | 0 | 0 | 0 | 2 | 0 | 0 | 1 | 0 |
| 5 | 0 | 1 | 0 | 1 | 0 | 2 | 0 | 0 | 2 | 0 |
| 6T | 0 | 1 | 1 | 0 | 0 | 2 | 0 | 1 | 0 | 0 |
| 6 | 0 | 1 | 1 | 0 | 0 | 0 | 0 | 1 | 0 | 0 |
| 7T | 0 | 1 | 1 | 1 | 0 | 2 | 0 | 2 | 0 | 0 |
| 7 | 0 | 1 | 1 | 1 | 0 | 0 | 2 | 0 | 0 | 0 |
| 8 | 1 | 0 | 0 | 0 | 1 | 0 | 0 | 0 | 1 | 0 |
| 9 | 1 | 0 | 0 | 1 | 1 | 0 | 0 | 0 | 2 | 0 |
| 10 | 1 | 0 | 1 | 0 | 1 | 0 | 0 | 1 | 0 | 0 |
| 11 | 1 | 0 | 1 | 1 | 1 | 0 | 0 | 2 | 0 | 0 |
| 12 | 1 | 1 | 0 | 0 | 2 | 0 | 0 | 0 | 1 | 0 |
| 13 | 1 | 1 | 0 | 1 | 2 | 0 | 0 | 0 | 2 | 0 |
| 14 | 1 | 1 | 1 | 0 | 2 | 0 | 0 | 1 | 0 | 0 |
| 15 | 1 | 1 | 1 | 1 | 2 | 0 | 0 | 2 | 0 | 0 |

T MEANS TENTATIVE, BEFORE MERGE/SKIP

Fig-2

| SERIAL NUMBER | DATA WORD | | | | TERNARY CODE WORD | | | | | |
|---|---|---|---|---|---|---|---|---|---|---|
| | D1 | D2 | D3 | D4 | P1 | P2 | P3 | P4 | P5 | P6 |
| 0 | 0 | 0 | 0 | 0 | 0 | 0 | 0 | 1 | 0 | 0 |
| 1 | 0 | 0 | 0 | 1 | 0 | 0 | 0 | 2 | 0 | 0 |
| 2 | 0 | 0 | 1 | 0 | 0 | 0 | 1 | 0 | 0 | 0 |
| 3 | 0 | 0 | 1 | 1 | 0 | 0 | 2 | 0 | 0 | 0 |
| 4 | 0 | 1 | 0 | 0 | 0 | 1 | 0 | 0 | 0 | 0 |
| 5 | 0 | 1 | 0 | 1 | 0 | 2 | 0 | 0 | 0 | 0 |
| 6 | 0 | 1 | 1 | 0 | 0 | 1 | 0 | 0 | 1 | 0 |
| 7 | 0 | 1 | 1 | 1 | 0 | 2 | 0 | 0 | 1 | 0 |
| 8 | 1 | 0 | 0 | 0 | 1 | 0 | 0 | 0 | 0 | 0 |
| 9 | 1 | 0 | 0 | 1 | 1 | 0 | 0 | 0 | 1 | 0 |
| 10 | 1 | 0 | 1 | 0 | 1 | 0 | 0 | 1 | 0 | 0 |
| 11 | 1 | 0 | 1 | 1 | 1 | 0 | 0 | 2 | 0 | 0 |
| 12 | 1 | 1 | 0 | 0 | 2 | 0 | 0 | 0 | 0 | 0 |
| 13 | 1 | 1 | 0 | 1 | 2 | 0 | 0 | 0 | 1 | 0 |
| 14 | 1 | 1 | 1 | 0 | 2 | 0 | 0 | 1 | 0 | 0 |
| 15 | 1 | 1 | 1 | 1 | 2 | 0 | 0 | 2 | 0 | 0 |

Fig_6

TERNARY DATA ENCODING SYSTEM

This application is a continuation of application Ser. No. 260,248, filed May 5, 1981, abandoned.

BACKGROUND OF THE INVENTION

1. Field of the Invention

This invention relates to an apparatus and method for encoding binary digital data in ternary form and has applicability to digital data communication systems and magnetic data storage systems. The invention is described herein with reference to a magnetic data storage system utilizing two level ternary data encoding.

2. Description of the Prior Art

The desirability of encoding binary data before it is recorded on a magnetic medium has been recognized and has resulted in substantial increases in the data capacity of magnetic recording systems without substantial alteration to the physical characteristics of the read/write head and/or the medium. A summary of some of the known techniques for encoding data is set forth in commonly owned U.S. Pat. No. 4,323,931, issued Apr. 6, 1982. Also summarizing various prior art binary recording techniques are articles entitled, "An Optimization of Modulation Codes in Digital Recording" by T. Horiguchi and K. Morita, IEEE Transactions on Magnetics, volume MAG-12, no. 6, Nov. 6, 1976 and "A New Look Ahead Code for Increased Data Density" by G. V. Jacoby, published in IEEE Transactions on Magnetics, volume MAG-13 no. 5, September, 1977. The above noted references summarize the progression development of codes from the so-called NRZ code to and including the 3PM code with the resultant substantial increase in the storage capacity of magnetic data storage equipment such as disk packs and the like.

SUMMARY OF THE INVENTION

The present invention further improves the capacity of a magnetic recording system. According to the invention, data in the form of a series of binary digits is encoded into a ternary code having three code symbols referred to herein respectively as 0, 1 and 2. Reliability of data recording and recovery is assured by using saturation recording and by providing write signals and magnetic signals formed thereby which are readily distinguishable from one another.

The ternary recording system of the present invention also employs the merging techniques described in the above cited U.S. patent, with some variations unique to ternary encoding as will be described hereinafter, so as to increase further the amount of data represented by a single magnetic change on the medium. In addition, the substitution techniques described in said U.S. Pat. No. 4,323,931 for limiting the maximum distance between adjacent magnetic signals may also be used in the ternary recording system of the present invention, again with some variations unique to ternary encoding as will be more fully explained hereinafter.

An object of the invention is to increase the data capacity of a magnetic data storage system without altering the read/write head, the magnetic medium or the interface between the head and the medium. This object is achieved by encoding a binary data stream into a ternary code in which one ternary state is manifested on the medium by lack of a transition, another ternary state is manifested by a first magnetic pattern and a third magnetic state is manifested by a second magnetic pattern. In the form of the invention that is described with more particularity hereinafter the first magnetic pattern is a transition from one polarity of saturation to the opposite polarity, and the second magnetic patternn is a pair of closely spaced transitions, the first going from one polarity to the other polarity and the second returning to the original polarity.

A system embodying the invention has a density ratio of data storage that is thirty three percent higher than the 3PM system described in the aforementioned. Moreover, the time window employed in reading the data is thirty three percent longer than the window in the 3PM system. Further, propagation of an erroneously recorded code bit on the medium is limited to one code word.

The foregoing together with other objects, features, and advantages will be more apparent after referring to the following specification and the accompanying drawings.

DETAILED DESCRIPTION OF THE PREFERRED EMBODIMENT

Figure 1:
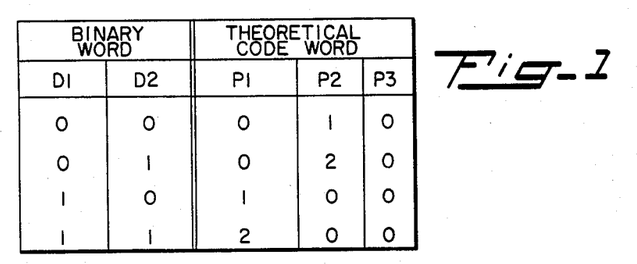
FIG. 1 is a simplified table showing a preferred technique for encoding binary data into ternary form.

The ternary code exemplified by the table of FIG. 1 converts a data word formed by two successive binary data bits D1 and D2 into a code word having three positions or detents. The positions are identified as P1, P2 and P3. The code positions or detents can have one of three values: 0, 1 or 2. A 0 is manifested on the recording/medium by absence of a transition, a 1 is manifested by a transition from saturated magnetization of one polarity to saturated magnetization of the opposite polarity, and a 2 is manifested by two closely spaced transitions, such two closely spaced transitions sometimes being referred to hereinafter as a pulse.

The code pattern chosen for each of the four data words seen in FIG. 1 has two 0's and one other ternary number, either a 1 or a 2. Thus two data bits are represented by one magnetic change. Certain combinations of data words produce adjacent code words that have excessively close magnetic changes. The code words for such combinations are modified by merging or skipping as shown in FIG. 2.

Figure 2:
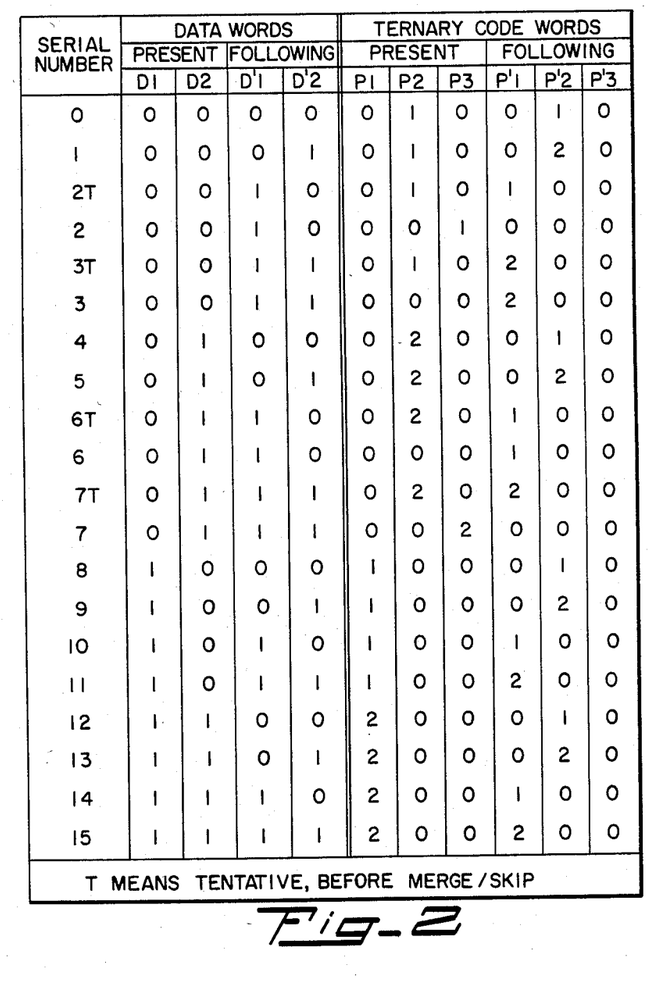
FIG. 2 is a complete encoding table illustrating the preferred encoding technique with merging to assure that the minimum distance between adjacent magnetic patterns is at least a predetermined amount.

In FIG. 2 D1 and D2 identify the bits in a present data word, and D'1 and D'2 identify the bits in the next following or succeeding data words. P1, P2 and P3 identify the positions or detents in a present coded word corresponding to the data word composed of bits D1 and D2, and P'1, P'2 and P'3 identify the positions or detents in a following or succeeding code word corresponding to the data word composed of bits D'1 and D'2.

The rows or data word combinations in the table of FIG. 2 identified by serial number 0 and serial number 1 illustrate the desired condition that any two successive magnetic changes (those occurring in positions P2 and P'2) are separated from one another by at least two zeros, that is by at least two positions or detents in which no magnetic change occurs. It will be noted further that serial number 0 is distinguished from serial number 1 by the specific code signal recorded in the P'2 position. Study of the table in FIG. 2 will show that all code words derived from the coding technique shown in FIG. 1 have at least two zeros between adjacent magnetic signals, except the patterns identified by serial numbers 2T, 3T, 6T and 7T. Those four patterns are therefore converted by merging or skipping to form the code patterns (serial numbers 2, 3, 6 and 7) so as to preserve the minimum of two zeros between any two adjacent code signals.

The following merge or skip rules are employed in deriving code words identified as serial numbers 2, 3, 6 and 7 from the patterns identified as serial numbers 2T, 3T, 6T and 7T respectively:

A. If position P2 of the present code word and position P'1 of the following code word have the same ternary code symbols they will be merged into an identical code symbol at position P3 and a ternary 0 code symbol will occur at both of the original positions, P2 and P'1.

B. If position P2 of the present word and position P'1 have different ternary code symbols, the ternary code symbol at position P'1 will remain unchanged and the ternary code symbol originally at position P2 will be skipped and replaced by a ternary 0 code symbol.

Figure 3:
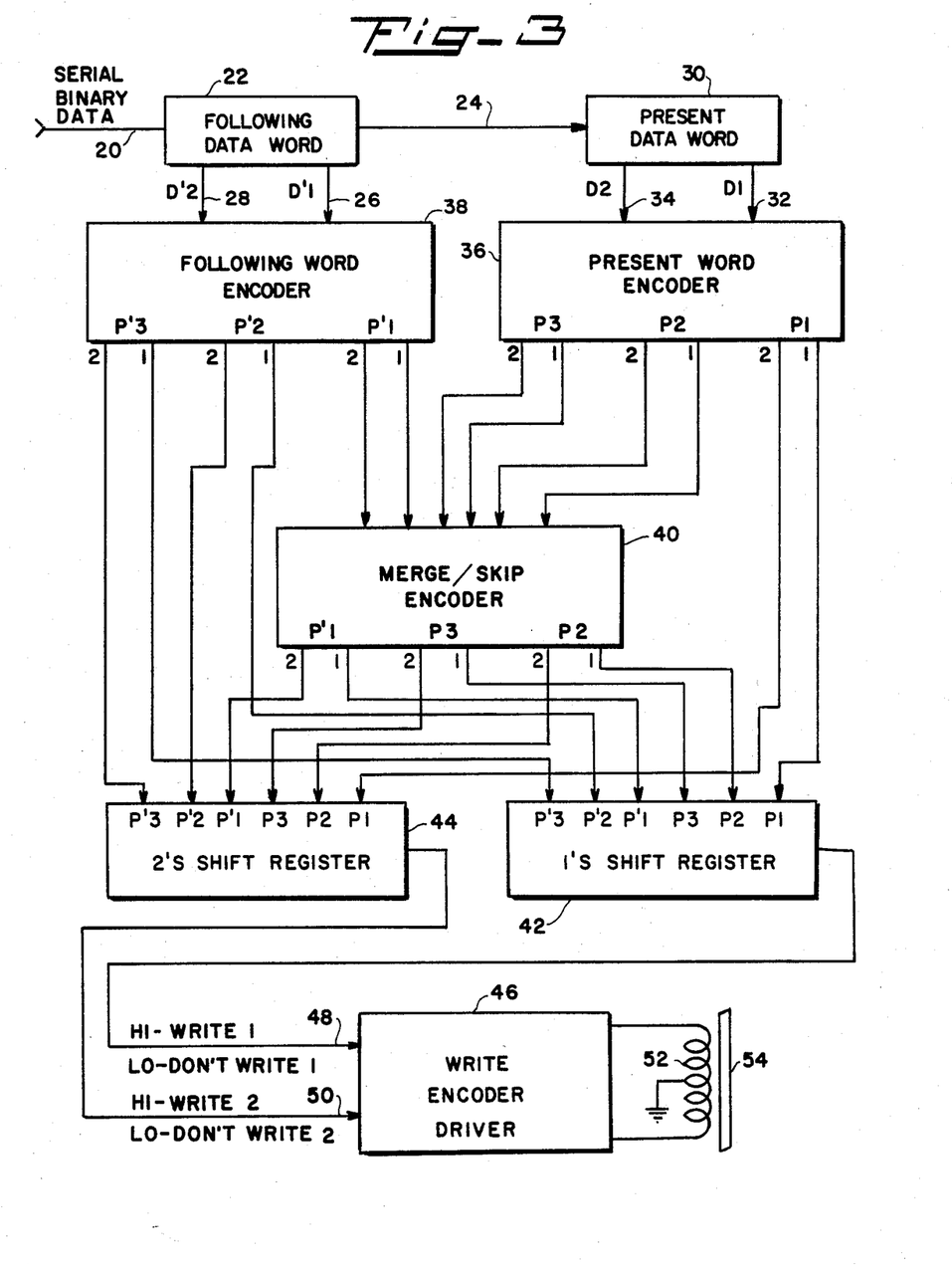
FIG. 3 is a block diagram of an encoding and recording circuit for carrying out the encoding technique shown in FIGS. 1 and 2.

Referring to FIG. 3 the binary data identified as D1, D2, D'1 and D'2 in FIG. 2 is applied as the input to the circuit at terminal 20. Terminal 20 constitutes the serial input of a shift register 22 which has a serial output 24 and parallel outputs 26 and 28. Serial output 24 is coupled to the serial input of a second shift register 30 which has parallel outputs 32 and 34. Thus, four binary data bits entering the system in serial form are converted to parallel form by shift registers 22 and 30. For encoding the data words in accordance with the scheme tabulated in FIG. 2 there is a present word encoder 36 coupled to receive the output of shift register 30 and a following word encoder 38 coupled to receive the output of shift register 22. Encoders 36 and 38 are preferably Read-Only Memories (ROMS) which are constructed to achieve the encoding or mapping tabulated in FIG. 2. It will be noted that the outputs of encoders 36 and 38 are each six in number; three represent 1's in the respective positions and three represent 2's in same positions. It is to be understood that these numeric designations are for identification only because the encoders are binary devices and their outputs have one of two values, high or low.

For implementing the previously mentioned merge or skip rules, there is a merge/skip encoder 40 which can also be embodied in a ROM. The inputs to merge/-skip encoder 40 are constituted by the P2 and P'1 outputs of encoders 36 and 38. The merge/skip encoder 40 is constructed and arranged to achieve the code patterns shown in FIG. 2 at serial numbers 2, 3, 6 and 7.

Merge/skip encoder 40 is a binary device so that the outputs thereof are in either a low state or a high state. Thus, as in the case of present word encoder 36 and following word encoder 38, there are separated outputs representative of the ternary 1 and ternary 2 code symbols for positions P'1, P3 and P2. The outputs of merge/skip encoder 40 are coupled to the inputs of a 1's shift register 42 and a 2's shift register 44. Shift registers 42 and 44 have parallel inputs and serial outputs and act to convert the parallel input signals to serial output signals. The 1's shift register has six inputs coupled to the respective 1 outputs of encoders 36, 38 and 40, and the 2's shift register 44 has six inputs coupled to the 2 outputs of such encoders. Thus, the 1's shift register will produce a serial output only in correspondence with a 1 input to any of its input terminals and the 2's shift register 44 will produce a serial output only in response to application of a 2 to one of its inputs. The serial outputs of shift registers 42 and 44 are connected as inputs to a write encoder driver 46, the input from 1's shift register 42 being indicated at 48 and the input from 2's shift register 44 being indicated at 50. Write encoder driver 46 includes a current source for energizing a magnetic read/write head 52 and input circuitry to the current source for controlling the same in accordance with the signal conditions at inputs 48 and 50. Read/write head 52 interfaces with a disk 54 or like magnetizable medium so as to afford storage of the ternary code symbols in the form of magnetic changes on the surface of the medium.

The timing of the foregoing operations is similar to that explained for the two-thirds rate encoding system described in commonly owned U.S. Pat. No. 4,337,458, issued June 29, 1982. More specifically, a data bit clock applied to present data word shift register 30 and following data word shift register 22 operates to shift the input serial binary data through the shift registers at the data rate. At the outset of encoding, after the first four data bits (first two binary data words) have been loaded into registers 22 and 30, a meomentary word clock pulse applied to 1's shift register 42 and 2's shift register 44 causes the code signals corresponding to the two data words to be loaded into registers 42 and 44. A position clock applied to registers 42 and 44 and occurring at a rate one and a half times that of the data bit clock functions to shift the code signals at positions P1, P2 and P3 out of registers 42 and 44 to the input of write encoder driver 46 during the same interval that the following data word is being shifted into present data word register 30 and the next two binary data bits are shifted into following data word register 22. Then the cycle repeats on occurrence of the next word clock pulse (after every two data bit clocks) applied to 1's and 2's registers 42 and 44 for loading new code signals therein. It will be noted that, except for the first data word, each succeeding data word is encoded twice, first when it is stored in following data word register 22 and again after it is shifted into present data word register 30. If the new code signals corresponding to a data word are different on the occasion of the second encoding from those produced on the occasion of the first encoding, the new code signals loaded into positions P1, P2 and P3 of 1's and 2's shift registers 42 and 44 overwrite the code signals shifted into those positions from positions P'1, P'2 and P'3. Referring to FIG. 2 though it will be noted that such overwrite must not occur in the case of the serial numbers 2 and 7 data word combinations because the code signals corresponding to the ternary 1 and ternary 2 code symbols at the P'1 position have already been merged to the P3 position. Such overwrite is precluded simply by sensing when a merge has occurred, that is when a signal appears at the P3 output of merge/skip encoder 40, and in such instances inhibiting the word clock applied to 1's and 2's shift registers 42 and 44, whereby no new code signals are loaded therein until the contents of such registers have been shifted six positions.

Figure 4:
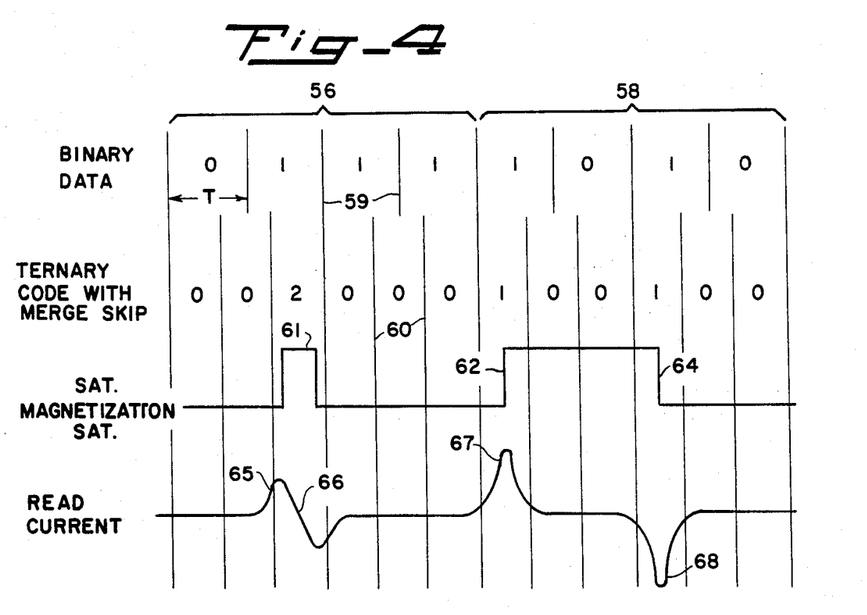
FIG. 4 is a timing diagram showing encoding, recording and reading of an exemplary sequence of binary data bits.

Referring to FIG. 4 there are shown at 56 and 58 binary data groups corresponding respectively to the rows in FIG. 2 identified as serial numbers 7 and 10. The binary bits regularly occur at an interval T, the boundaries of such intervals being indicated in FIG. 4 by vertical lines 59. Below the binary data stream is the ternary code generated by the circuit of FIG. 3 and applied to the inputs of write encoder driver 46. Each position or detent in the ternary code is within a cell having a duration of $\frac{2}{3}T$ and having boundaries indicated by vertical lines 60. Below the ternary code is the magnetization recorded on the magnetizable medium by magnetic head 52 in response to the ternary code signals applied to write encoder driver 46, there being a ternary 2 in the form of a pulse 61 and two ternary 1's in the form of transitions 62 and 64. Since both a ternary 1 and a ternary 2 are represented by a high level signal applied to write encoder driver 46, the write encoder driver responds to a ternary 1 by supplying current to the magnetic head so as to change the magnetization on the medium from saturation in one direction to saturation in the opposite direction, and responds to a ternary 2 by first supplying current to the magnetic head in one direction and then in the opposite direction so as to change the magnetization on the medium from saturation in one direction to saturation in the opposite direction and then back to saturation in the original direction. Logic circuits within write encoder driver 46 ascertain the instantaneous direction of current flow in the magnetic head to assure that appropriate switching thereof occurs. It will be noted that pulse 61 is centered within a cell and that both its positive going and negative going portions are within the cell. It will be further noted that transitions 62 and 64 are in the centers of respective cells. The ternary code is recorded on medium 54 by means of saturation recording with all its attendant benefits.

The lowermost curve in FIG. 4 indicates the read voltage induced in the head in response to movement therepast of medium 54 which has been magnetized as shown in FIG. 4. The magnetization on medium 54 represented by pulse 61 produces a doublet signal 65, 66. The magnetization on the medium represented by transitions 62 and 64 produce respective single pulse signals 67 and 68. The positive and negative amplitudes of doublet signal 65, 66 is less than that of signals 67 and 68 because the closely spaced changes of pulse 61 interact on read out to shift and attenuate the peaks of doublet signal 65, 66 induced in read/write head 52 as is well known in the art.

Figure 5:
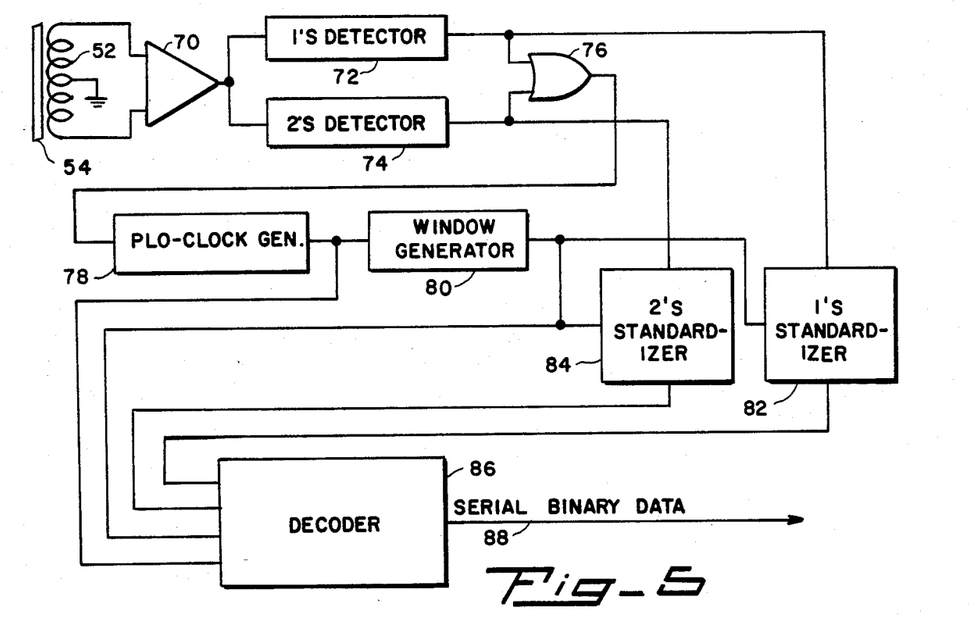
FIG. 5 is a block diagram of a circuit for reading and decoding data recorded in accordance with the invention.

The binary data can be recovered from the read voltage by the circuit shown in block diagram form in FIG. 5. As medium 54 moves with respect to head 52 in the read mode, information recorded on the medium in accordance with the invention induces in the head a read voltage consisting of single pulses or doublet pulses as described above in connection with FIG. 4. The read head output is coupled to a preamplifier 70, the output of which is coupled to a 1's detector 72 and a 2's detector 74. Detectors 72 and 74 each respond to only one of the ternary signals and can employ one of many discrimination techniques. For example, detectors 72 and 74 can discriminate on the basis of amplitude because, as seen in FIG. 4, the read signal induced by a transition has a greater amplitude than the read signal induced by a pulse. Alternatively, the detectors can discriminate on the basis of area under the respective read voltage pulses or can employ a monostable multivibrator which has an output signal of a duration corresponding to that between the positive peak and the negative peak of the read voltage signal induced by a pulse so that occurrence of a pulse during the output of the monostable multivibrator indicates a ternary 2 and the lack of a pulse during such time indicates a ternary 1. In any event, it will be appreciated by those skilled in the art that detection of the position or time occurrence of transitions 62 and 64 is of paramount interest whereas in the case of pulse 61 it is detection of the position or time occurrence of the center of the pulse that is significant. Hence, read pulses 67 and 68 corresponding to transitions 62 and 64 respectively are detected in conventional manner by differentiating pulses 67 and 68 and sensing the zero crossings of the differentiated pulses as an indication of the position or time occurrence of the transitions. For the read signal doublet 65, 66 corresponding to pulse 61 the locations of the positive and negative going edges (transitions) of pulse 61 are not significant and in fact are not desired to be detected because of the shifting of the peaks of pulses 65 and 66 which inherently occurs due to the close proximity of the edges of pulse 61. The zero crossing of doublet 65, 66 however, has substantially no shift and is in fact precisely indicative of the center of pulse 61. Pulse 61 is therefore detected simply by sensing the zero crossing of the doublet, thus obviating the need for differentiation. This is very advantageous because, notwithstanding the diminution of the amplitudes of pulses 65 and 66, the elimination of differentiation affords significant enhancement of signal to noise ratio.

The outputs of 1's detector 72 and 2's detector 74 are coupled to an OR gate 76 which has its output coupled to the input of a phase locked oscillator (PLO) 78. The PLO produces in a well known fashion a clock pulse at a frequency corresponding to the rate at which magnetic signals recorded on medium 54 move with respect to head 52. The output of PLO 78 is coupled to a window generator 80 which creates a series of pulses corresponding to the position of vertical lines 60 in FIG. 4 so as to define between adjacent pulses time windows that define the time of occurrence of the ternary code positions as read from the medium.

The output of 1's detector 72 is coupled to a 1's standardizer 82 and the output of 2's detector 74 is coupled to a 2's standardizer 84. Also coupled to standardizers 82 and 84 is the output of window generator 80. The output of the respective standardizers constitute the code signals representative of the ternary code symbols shown in the right hand columns of FIG. 2. Simultaneous low outputs from standardizers 82 and 84 indicate that a 0 is present in the code signal. The code signals from standardizers 82 and 84 are coupled to a decoder circuit 86 to which the outputs of PLO generator 78 and window generator 80 are also coupled. The decoder includes a first shift register for converting the incoming serial data from the standardizers into parallel form, a ROM or like decoding circuit for converting the parallel encoded information to parallel binary information and a second shift register which converts the parallel binary data into serial binary data which is produced at the output 88 of the decoder.

To recapitulate operation of the embodiment of the invention shown in FIGS. 1–5, it is assumed that a string of binary data is applied to input terminal 20 of the circuit of FIG. 3. The incoming serial data word is grouped into a present data word and a following data word by shift registers 22 and 30, all data word combinations being shown in FIG. 2. Encoding of the data words into ternary code words is achieved in encoders 36 and 38 for twelve of the sixteen combinations seen in FIG. 2. The other four data words, those identified as serial numbers 2, 3, 6, 7, are derived from merge/skip encoder 40 coacting with encoders 36 and 38 so that the ternary code signals are loaded into various positions of shift registers 42 and 44.

Write encoder driver 46 receives the ternary code signals from shift registers 42 and 44 and forms the code signals into bidirectional currents, which when applied to read/write head 52, produce magnetic transition patterns between opposite saturation polarities on medium 54. For a ternary 0 code symbol no write current change is supplied to head 52; for a ternary 1 code symbol a signal change exemplified by transitions 62 and 64 is formed; and for a ternary 2 code symbol a signal change exemplified by pulse 61 is formed. Such signal changes or magnetization patterns are formed in response to currents produced by write encoder driver 46 and applied to head 52. The ternary code symbols are thus stored on medium 54 in readiness for readout. The magnetic change representative of a ternary 1 code symbol is different from the magnetic change representative of a ternary 2 code symbol and therefore the changes are readily distinguished on read out. Moreover, since the magnetic changes employ saturation of the medium at one or the other polarity, accurate recovery of data is facilitated.

The magnetic changes for a ternary 1 code symbol are distinguishable from the magnetic changes for a ternary 2 code symbol because the two transitions in a pulse constituting a ternary 2 are spaced sufficiently close to one another that on read out the signals induced in head 52 by the closely spaced transitions interact with one another to effect a reduction in the amplitude of the voltage induced in the head. Pulse 61 exemplifies the condition that the transitions are spaced from one another by an amount no greater than the interval defining a code cell, that is, the interval between adjacent vertical lines 60. In contrast, transitions 62 and 64 are spaced from one another and from pulse 61 by an amount significantly greater than the duration of a code cell so that each transition representative of a ternary 1 code symbol induces in head 52 a voltage pulse, such as indicated at 67 and 68, that is independent of adjacent transitions of opposite polarity. Thus, the amplitude of pulses 67 and 68 is significantly greater than, and distinguishable from, the amplitude of pulses 65 and 66.

As the magnetic changes on medium 54 interact with head 52, the read voltage signals shown in the lower curve of FIG. 4 are produced and such signals are amplified by amplifier 70 (see FIG. 5). A signal indicating the occurrence of a ternary 1 code symbol is produced at the output of 1's detector 72 and a signal indicating the occurrence of a ternary 2 code symbol is produced at the output of 2's detector 74. In response to a time window produced by PLO 78 and window generator 80, standardizers 82 and 84 produce signals indicating, respectively, that a ternary 1 or a ternary 2 code symbol has been produced within a given time window. Lack of signals on the outputs of both standardizers during a time window indicates that a ternary 0 code symbol has been produced. Such signals are decoded by decoder 88 so as to recover the originally stored serial binary data.

Inspection of FIG. 2 indicates that the minimum number of detents or positions between two adjacent code symbols or magnetic changes is two. This is advantageous to avoid interaction between two adjacent magnetic changes on the medium, which as is well known, makes difficult the accurate recovery of data from the medium. The maximum number of detents without any magnetic change is exemplified by a serial number 2 data word combination followed by a serial number 3 data word combination, there being 6 detents without a magnetic change. Such maximum number of detents without a magnetic change has the result of not synchronizing PLO 78 for a corresponding period of time. Present PLO technology is such, however, that a clock signal of accurate frequency can be sustained notwithstanding the relatively long duration without application of a synchronizing pulse to the PLO.

Figure 6:
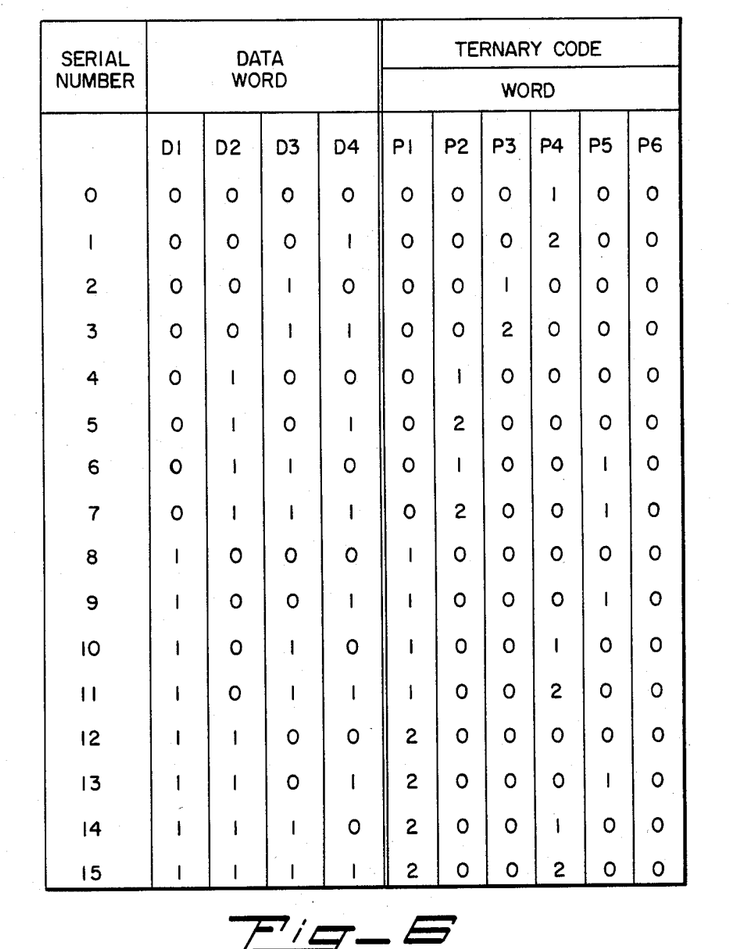
FIG. 6 is an encoding table illustrative of an alternate encoding technique in accordance with the principles of the invention.

The encoding scheme shown in FIG. 2 is merely exemplary. An alternate encoding scheme is shown in the table of FIG. 6 which is carried out with the circuit of FIG. 3 with minor modifications as follows. Present data word register 30 and following data word register 22 each store four bit words. Present word encoder 36 and following word encoder 38 are hexadecimal encoders which respond to the four bit words to produce code signals at positions P1, P2, P3, P4, P5 and P'1, P'2, P'3, P'4, P'5 respectively. Merge/skip encoder 40 performs merging operations only, inclusive of skip operations, for reasons that will be explained momentarily and responds to code signals at position P5 of the present word encoder and position P'1 of the following word encoder to produce signals merged to intermediate position P6 as required to maintain a desired minimum spacing between ternary 1 and/or ternary 2 code symbols. In other words the outputs of encoder 40 become P5, P6 and P'1 in place of P2, P3 and P'1 respectively. The 1's shift register 42 and 2's shift register 44 in turn are each capable of receiving twelve inputs P1 to P6 plus P'1 to P'6 with six positions being read out serially during an interval when four binary data bits are being serially loaded into present data word register 30 and following data word register 22. In the encoding scheme shown in FIG. 6, four binary data bits are encoded into six ternary code signal positions. The identification of columns in FIG. 6 corresponds to that employed in FIG. 2. Inspection of FIG. 6 indicates that position P6 is tentatively encoded as a ternary 0 code signal in all cases. When position P5 of a present word and position P'1 of a following word both contain a ternary code signal, either a ternary 1 or 2 code symbol, a merging place by deleting the code signals tentatively encoded into positions P5 and P'1 and writing into position P6 the symbol tentatively encoded at position P'1. Such merging ensures avoidance of ambiguity because it will be noted that tentative encoding of position P5 is always a ternary 0 or 1 and never a ternary 2. Further inspection of FIG. 6 indicates that merging will be required when the following word is a word identified by a serial numbers 8–15, inclusive, and the present word is a word identified by serial numbers 6, 7, 9 or 13. Since position P5 is encoded only as a ternary zero or ternary 1 code symbol and never as a ternary 2 code symbol, merging alone is sufficient to maintain at least two zeros between ternary 1 and/or ternary 2 code symbols, that is, a skip operation is not required. More specifically, if a serial number 8, 9, 10 or 11 data word follows a serial number 6, 7, 9 or 13 data word the ternary 1 code signal at position P5 of the present data word and the ternary 1 code signal at position P'1 of the following data word are merged as a ternary 1 code signal to position P6 corresponding to the present data word. Alternatively, if a serial number 12, 13, 14 or 15 data word follows a serial number 6, 7, 9 or 13 data word the ternary 1 code signal at position P5 of the present data word and the code signal representative of a ternary 2 at position P'1 of the following data word are merged as a code signal representative of a ternary 2 code symbol to position P6 corresponding to the present data word. Detection of a ternary 1 code symbol at a P6 position during data recovery operation is construed as a ternary 1 code symbol at the associated P5 and P'1 positions. Detection of a ternary 2 code symbol at a P6 position during data recovery operation is interpreted as representative of a ternary 2 at the associated P'1 position and as a ternary 1 at the associated P5 position which, as previously mentioned, is correct because only ternary 0 or ternary 1 code symbols are encoded at position P5.

In addition to performing a merging operation for maintaining a prescribed minimum spacing between adjacent ternary 1 and/or ternary 2 code symbols, a substitution procedure somewhat like that explained in the aforementioned 3PM U.S. Pat. No. 4,323,931 may be utilized in the present invention to preclude the maximum spacing between adjacent ternary 1 and/or ternary 2 code symbols from exceeding some predetermined amount. Referring to FIG. 6, it will be noted that serial number 4, 5, 8 and 12 data words have a ternary 1 or ternary 2 code symbol occurring only in the P1 or P2 positions whereas serial number 0, 1, 2 and 3 data words do not have a ternary 1 or ternary 2 code symbol occurring at the P1 and P2 positions. Thus, for various combinations of such data words, one following the other, anywhere from six to eight ternary zeros may occur intermediate ternary 1 and/or ternary 2 code symbols. By using alternate code signal patterns, as will be explained momentarily, in such instances the number of ternary zeros between ternary 1 and/or ternary 2 code symbols will be held to a maximum of six thus assuring more frequent synchronization of the phase locked oscillator on read out and enhancing data recovery. FIG. 6 indicates that position P3 has a ternary 1 or ternary 2 code symbol only for the serial number 2 and 3 data words which do not have a ternary 1 or ternary 2 code symbol at the P1 position whereby merging to a P6 position will not occur when a serial number 2 or 3 data words follows a serial number 6, 7, 9 or 13 data word for which a ternary 1 code symbol appears at the P5 position. Hence alternate patterns can be substituted in the following manner for holding the number of ternary zeros to a predetermined maximum between ternary 1 and/or ternary 2 code symbols. In the cases of a serial number 4 or 5 data word followed by a serial number 0, 1, 2 or 3 data word the ternary code symbol at position P2 for the present data word is shifted to position P3 and a ternary 1 code symbol is inserted at position P6 of the present data word thereby ensuring unique coding to facilitate recovery of the various combinations of such data words. In other words the ternary 1 code symbol at position P6 accompanied by a ternary 1 or ternary 2 code symbol at position P3 indicates that symbol at the P6 position is to be omitted on data recovery, that is, not interpreted as the merger of code signals at position P5 of the present word and position P'1 of the following word and the symbol at the P3 position is to be construed as the same symbol properly at the P2 position. In those cases of serial number 8 or 12 data word followed by a serial number 0, 1, 2 or 3 word, the ternary conde symbol at position P1 is shifted to position P3 and a ternary 2 code symbol is inserted at position P6 as indicative of the shift from the P1 to the P3 position.

Thus it will be seen that the present invention provides a method for encoding data in ternary form and an apparatus for carrying out such method which increases the capacity of the magnetic medium without requiring any change in the medium and/or the read/write head associated with the medium. This is made possible by appropriately encoding the binary data and by recording the encoded data by saturation recording techniques.

The ternary encoding system described herein is not limited to encoding by the use of a transition to represent a ternary 1 code symbol and use of a pulse to represent a ternary 2 code symbol. Other kinds of signal changes may also be used. For example, a ternary 1 may be represented by a transition of one polarity and a ternary 2 represented by a transition of opposite polarity. Alternatively, pulses of opposite polarity may be used to represent the ternary 1 and ternary 2 symbols. In such systems, control transitions would be inserted, in accordance with well known techniques, as needed to make a transition or pulse change of appropriate polarity. Likewise, the ternary 0 code symbol is not limited to being represented by an absence of signal change but instead may be represented by some kind of signal change intermediate or different from a ternary 1 or ternary 2 code symbol.

While a preferred embodiment of the invention has been described in specific detail, it will be understood that various modifications and substitutions may be made therein without departing from the spirit and scope of the invention as defined in the appended claims.

We claim:

1. A two level ternary encoding system for converting binary data consisting of a series of binary data bits into a series of corresponding ternary code signals each representative of ternary 0 code symbol, a ternary 1 code symbol or a ternary 2 code symbol, and for producing said ternary code signals in intervals each interval including a code signal position, said encoding system comprising:

data storage means having an input and an output, said data storage means for receiving at a first clock rate a binary data word and a following binary data word each data word including at least two binary data bits, first encoding means coupled to the output of said data storage means for simultaneously receiving said binary data word and said following binary data word and for producing groups of three corresponding code signals for each two bit binary data word and following data word each code signal representative of a ternary code symbol and associated with a discrete code signal position, second encoding means coupled to the output of said first encoding means for re-encoding certain predetermined ones of said code signals into code signals in which signals, other than those representative of a ternary 0 symbol, are separated by a predetermined minimum and a maximum number of said intervals, and ternary code symbol generating means coupled to receive code signals from said first encoding means and said second encoding means for producing in response to a second clock rate operating at one and one-half that of said first clock rata and within an interval including a code signal position a plurality of transitions between first and second signal levels in response to a code signal representative of one of said ternary 1 and 2 code symbols, producing in a different interval including a code signal position a single transition between the first and second signal levels in response to a code signal representative of the other one of said ternary 1 and 2 code symbols, and an absence of any signal change between the first and second signal levels within an interval in response to code signal representative of a ternary 0 code symbol.

2. The system of claim 1 wherein said predetermined minimum number of said intervals provided by the re-encoding of said second encoding means is two.

3. The system of claim 1 wherein the second encoding means is operative to preclude adjacent code signals other than signals representing a ternary 0 code symbol from being spaced more than a maximum of six of said intervals.

4. The system of claim 1 wherein the second encoding means functions to merge similar code signals other than those representative of a ternary 0 that are spaced less than the predetermined minimum number of intervals to a position intermediate the positions of such code signals so that all adjacent code signals other than those representative of a ternary 0 are spaced from one another at least the predetermined minimum.

5. The system of claim 4 wherein the second encoding means functions to skip a preselected one of two dissimilar code signals representative of ternary symbols other than a ternary 0 symbol whenever said two dissimilar signals are spaced less than said predetermined minimum number of intervals.

6. The system of claim 1 wherein a ternary 1 code symbol is represented by a single transition between two signal levels and a ternary 2 code symbol is represented by two successive transitions between the two signal levels within their respective intervals.

7. The system of claim 6 wherein the first and second encoding means are operative to produce code signals other than those representing ternary 0 symbols that are spaced at least a predetermined minimum from one another by merging identical code signals spaced less than the predetermined minimum from their signal positions to an intermediate code signal position and by replacing the unoccupied signal positions with code signals representing ternary 0 symbols.

8. The system of claim 1 wherein the second encoding means is responsive to a data word to be encoded and the following data word so that for code signals spaced less than the predetermined minimum distance and representative of the same ternary code symbol the predetermined minimum spacing between adjacent code signals is maintained by merging such code signals to a code signal representative of a like ternary code symbol at a position intermediate the positions of the merged code signals whereas for code signals spaced less than the predetermined minimum distance where one of such code signals is representative of a ternary 1 code symbol and the other such code signal is representative of a ternary 2 code symbol the predetermined minimum distance between adjacent code signals is maintained by omitting one of said code signals and retaining the other code signal at its original code signal position.

9. The system of claim 8 wherein the omitted code signal is associated with the data word being encoded and the retained code signal is associated with the following data word.

10. The system of claim 6 wherein the first and second encoding means are operative to preclude adjacent code signals other than signals representing ternary 0 symbols from being spaced more than a maximum of six ternary 0 symbol signals by inserting a code signal at a preselected position as necessary and shifting some other code signal to a different position, such inserted code signal being representative of a ternary 1 code symbol when the shifted code signal is shifted one distance from its original position and representative of a ternary 2 code symbol when the shifted code signal is shifted another distance from its original position.

11. The system of claim 6 wherein the first and second encoding means are operative such that for code signals, other than ternary 0 symbol signals, spaced less than a predetermined minimum number of intervals and representative of the same ternary code symbol the predetermined minimum spacing between adjacent code signals is maintained by merging such code signals to a code signal representative of a like ternary code symbol at some other code signal position whereas for code signals spaced less than the predetermine minimum where one of such code signals is representative of a ternary 1 code symbol and the other such code signal is representative of a ternary 2 code symbol the predetermined minimum spacing between adjacent code signals is maintained by omitting one of said code signals and retaining the other code signal at its original code signal position.

12. Apparatus for encoding a series of binary data bits as a series of ternary code symbols identified as ternary 0, ternary 1, and ternary 2, said apparatus comprising;

data storage means under the control of a first clock signal for successively grouping n binary data bits to form a series of groups each having any one of $2^n$ values where n is a positive interger greater than one, encoding means having n inputs coupled to said data storage means and m outputs where m is a positive interger greater than n, said encoding means establishing on said outputs a pattern of ternary code signals uniquely representative of the value of a binary bit group applied to said inputs, said encoding means further including means for re-encoding certain of said ternary code signals to assure that all code signals other than those representative of a ternary 0 are positioned between a predetermined minimum and maximum spacing, serializing means, under the control of a second clock signal at a frequency of one and one-half that of said first clock signal, coupled to said encoding means and responsive to said ternary code signals for producing a serial stream of ternary code signals at or proximate preselected code signal positions, and ternary code symbol generating means coupled to said serializing means for forming at or proximate positions corresponding to a ternary code 1 code signal a first type of signal change between two signal levels and at or proximate positions corresponding to a ternary 2 code signal a second type of signal change between said signal levels and an absence of signal change at positions corresponding to a ternary 0 code signal.

13. Circuitry for encoding input binary data into a corresponding two level ternary code wherein a ternary 1 code symbol is representated by a single signal transition between first and second signals levels within a predetermined fixed interval, wherein a ternary 2 code symbol is represented by two transitions between said signal levels within one of said intervals, and wherein a ternary 0 code symbol is represented by an absence of transition within other of said intervals, said circuitry comprising:

input data storage means under control of a first clock signal for receiving binary data and storing said data in data words each including at least two binary bits;

encoding means coupled to said input data storage means and responsive to said binary data words for producing code signals each representative of ternary code symbol and associated with a discrete code signal position, said encoding means including means for re-encoding certain of said code signals to assure that the code signals other than those representative of a ternary 0 symbol are separated by a predetermined minimum number of intervals without transitions;

ternary code symbol generating means, controlled by a second clock signal operating at a frequency of one and one-half that of said first clock signal, coupled to receive code signals from said encoding means for producing in an interval including a code signal position a single signal transition between first and second signal levels in response to a code signal representative of a ternary 1 code symbol, producing in a different interval including a code signal position two signal transitions between said first and second signal levels in response to a code signal representative of a ternary 2 code symbol, and an absence of transition between said signal levels within an interval in response to a signal representative of a ternary 0 code symbol; and recording means coupled to said ternary code symbol generating means for magnetically recording the generated ternary code symbol signals and for reading the recorded ternary code, the read current waveform representing a ternary 1 symbol being a singlet, and the current waveform representing a ternary 2 symbol being a doublet with amplitude less than that of said singlet.

* * * * *